(12) United States Patent
Lee

(10) Patent No.: US 8,981,555 B2
(45) Date of Patent: Mar. 17, 2015

(54) RIDGED INTEGRATED HEAT SPREADER

(75) Inventor: Ted Lee, Federal Way, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/997,149

(22) PCT Filed: Dec. 21, 2011

(86) PCT No.: PCT/US2011/066584
§ 371 (c)(1),
(2), (4) Date: Jun. 21, 2013

(87) PCT Pub. No.: WO2013/095457
PCT Pub. Date: Jun. 27, 2013

(65) Prior Publication Data
US 2014/0048924 A1   Feb. 20, 2014

(51) Int. Cl.
*H01L 23/34* (2006.01)
*H01L 23/42* (2006.01)
*H01L 23/433* (2006.01)

(52) U.S. Cl.
CPC ............. *H01L 23/34* (2013.01); *H01L 23/42* (2013.01); *H01L 23/433* (2013.01); *H01L 2224/16225* (2013.01); *H01L 2224/73253* (2013.01); *H01L 2924/15311* (2013.01)
USPC ........... 257/713; 257/675; 257/706; 257/711; 257/712; 257/717; 165/185

(58) Field of Classification Search
CPC ....... H01L 23/42; H01L 23/433; H01L 23/34; H01L 2224/16225; H01L 2224/73253; H01L 2924/15311
See application file for complete search history.

(56) References Cited

U.S. PATENT DOCUMENTS

| | | | |
|---|---|---|---|
| 6,163,073 A * | 12/2000 | Patel | ............................ 257/712 |
| 7,095,111 B2 | 8/2006 | Hu et al. | |
| 7,755,184 B2 | 7/2010 | Macris et al. | |
| 2004/0042178 A1 | 3/2004 | Gektin et al. | |

FOREIGN PATENT DOCUMENTS

KR   10-2006-0059989 A   6/2006

OTHER PUBLICATIONS

International Search Report mailed Sep. 3, 2012 for PCT/US2011/066584, filed Dec. 21, 2011, 4 pages.

* cited by examiner

*Primary Examiner* — Yasser A Abdelaziez
(74) *Attorney, Agent, or Firm* — Blakely, Sokoloff, Taylor & Zafman LLP

(57) ABSTRACT

An integrated circuit package is presented. In an embodiment, the integrated circuit package has a package substrate, an integrated circuit die attached to the package substrate, and a package level heat dissipation device, such as an integrated heat spreader, attached to the package substrate encapsulating the integrated circuit die. The package level heat dissipation device has a top side with a ridge formed on top of a perimeter of the top side, and a bottom side that couples to the integrated circuit die.

14 Claims, 4 Drawing Sheets

RIDGED INTEGRATED HEAT SPREADER

CROSS-REFERENCE TO RELATED APPLICATION

This patent application is a U.S. National Phase Application under 35 U.S.C. §371 of International Application No. PCT/US2011/066584, filed Dec. 21, 2011, entitled RIDGED INTEGRATED HEAT SPREADER.

FIELD OF THE INVENTION

This invention relates generally to an integrated circuit package. More specifically, this invention relates to an integrated heat spreader.

BACKGROUNDS AND RELATED ARTS

As the density of transistors and circuits in integrated circuit devices increases, thermal management of the integrated circuit device at the package and component levels is becoming more and more critical to the performance and longevity of the integrated circuit device. With the increasing demand for computing power, integrated circuit devices such as microprocessors are becoming more complex, and the number of processing cores integrated into a single chip is also increasing. As a result, integrated circuit dies such as microprocessor dies are becoming physically larger, and consequently, integrated circuit packages are also becoming larger, because larger package substrates are required to accommodate the larger dies. With larger integrated circuit packages, larger package level heat dissipation devices are needed to adequately cool the integrated circuit devices. Also, as the complexity of the integrated circuit devices increases, the number of socket contacts also continues to grow. With a greater number of socket contacts, a higher socket loading force is required to secure the integrated circuit package into a socket. The impact of larger packages and higher socket loads is an increase in the warpage of the package level heat dissipation device such as an integrated heat spreader (IHS).

FIG. 1 illustrates a cross section view of an integrated circuit package 100 before a component level heat dissipation device, such as a heat sink, is attached to the integrated circuit package 100. In the integrated circuit package 100, a package level heat dissipation device such as an integrated heat spreader (IHS) 150 is placed above an integrated circuit die 140 to provide a low thermal resistance path between the integrated circuit die 140 and a component level heat dissipation device above the IHS 150. During operation of the integrated circuit device, heat generated in the integrated circuit die 140 is dissipated through the IHS 150 up towards the component level heat dissipation device. To increase the thermal transfer efficiency and to provide adhesion between the IHS 150 and the component level heat dissipation device above the IHS 150, a thermal interface material (TIM), such as a phase change material or a thermal grease material that has a tendency to flow, is disposed on the top surface of the IHS 150 before the component level heat dissipation device is attached to the integrated circuit package 100. A layer of TIM 141 is also placed between the integrated circuit die 140 and the IHS 150.

FIG. 2 illustrates an integrated circuit package assembly 200 that shows the warpage of an IHS 150 after an integrated circuit package 100 has been inserted and secured in the socket 120, and after a heat sink 170 has been attached to the integrated circuit package 100. In socketed applications, an independent loading mechanism (ILM), which includes a load plate 181 and a retention frame 182, applies a downward force at the step 154 along the edges of the IHS 150 to secure the integrated circuit package 100 into the socket 120. Furthermore, the IHS 150 is also subjected to additional downward loading forces around the edges of the IHS 150 when the heat sink 170 is secured to the integrated circuit package 100 with connectors 183 that are mounted from the heat sink 170 onto the retention frame 182 of the ILM and/or onto the printed circuit board (PCB) 110 at attachment points overhanging the IHS 150. As a result of these downward forces from the ILM and the heat sink 170 being applied to the edges of the IHS 150, the top side of the IHS 150 can be warped when the integrated circuit package assembly 200 is assembled, creating a convex warpage on the top side of the IHS 150 as shown. The warpage, which is defined as the difference in height at the highest point 180A and the lowest point 180B on the top side of the IHS 150, can be over 100 microns (um).

The TIM 160 between the IHS 150 and the heat sink 170 tends to migrate outwards over the edge of the IHS 150 when the integrated circuit package 100 undergoes reliability testing such as shock, vibration, high temperature bake, and temperature cycling. The top side IHS 150 warpage exacerbates this migration, which in turn, causes empty voids 190 or air pockets between the IHS 150 and the heat sink 170. These voids 190 can cause severe degradation in the cooling capability of the heat sink 170, because with the formation of these voids 190, there is less surface area to transfer heat generated from the integrated circuit die 140 through the IHS 150 to the heat sink 170. For example, the degradation in the cooling capability can be on the order of 0.04 degrees Centigrade per Watt, and for a 125 Watt integrated circuit device, this degradation translates to an increase of 5 degrees Centigrade in the operating temperature of the integrated circuit device. Consequently, this leads to slower performance of the integrated circuit device and shortens the longevity of the integrated circuit device.

DETAILED DESCRIPTION OF THE PREFERRED EMBODIMENTS

The following description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in a simple block diagram format in order to avoid unnecessarily obscuring the present invention. Thus, the specific details set forth are merely exemplary. Particular implementations may vary from these exemplary details and still be contemplated to be within the spirit and scope of the present invention.

Reference in the description to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment. It is to be understood that the various embodiments of the invention, although different, are not necessarily mutually exclusive. Furthermore, the terms "above," "under," and "between" and "on" as used herein refer to a relative position of one component with respect to other components. As such, for example, one component above or under another component may be directly in contact with the other component or may have one or more intervening components.

Embodiments of the present invention disclose an improved package level heat dissipation device such as an integrated heat spreader (IHS) with a top side ridged perimeter to minimize thermal interface material (TIM) degradation in an integrated circuit package. The top side ridged perimeter of the IHS prevents TIM from flowing out from between the IHS and a package level heat dissipation device (e.g., a heat sink). This ensures good thermal contact between the IHS and the heat sink even when the IHS is warped due to forces exerted on the IHS by the package assembly. In an embodiment, a ridge is formed along the perimeter of the IHS to compensate for a convex warpage on the top surface of the IHS. In other embodiments, addition ridges are formed on the interior of the top side of the package level heat dissipation device to compensate for other types of warpage. In an alternative embodiment, a ridge is formed along a portion of the perimeter of the package level heat dissipation device.

Figure 5:
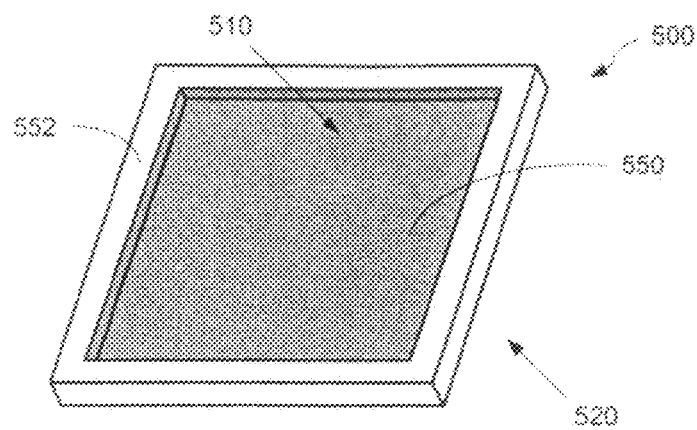
FIG. 5 illustrates an integrated heat spreader according to one embodiment of the present invention.

In accordance to one embodiment of the present invention, FIG. 5 illustrates a perspective view of an integrated heat spreader (IHS) 500. The IHS 500 is a planar piece of material with good heat conductivity properties. In an embodiment, the IHS 500 may be made of copper or diamond. The IHS 500 has a top side 510 and a bottom side 520. The top side 510 is configured to be thermally coupled to a component level heat dissipation device (e.g., a heat sink) through an interposed thermal interface material (TIM). The bottom side 520 is configured to be thermally coupled to an integrated circuit die through another layer of TIM. In an embodiment, the bottom side 520 has a cavity that is configured to sit above an integrated circuit die. Before being assembled into an integrated circuit package, the surface of the cavity on the bottom side 520 and the interior portion 550 of the top side 510 are substantially flat. In some embodiments, the IHS 500 may have a step (not shown) that extends laterally outward from the sidewalls of the outer edge of the perimeter of the bottom side 520. This step is used as loading points on the integrated circuit package where the integrated circuit package can be pushed down into a socket by an independent loading mechanism (ILM).

In one embodiment, the perimeter of the top side 510 is elevated relative to the interior portion 550 of the top side 510 to form a ridge 552 on the perimeter. The perimeter of the IHS 500 is elevated to a height that is less than the eventual compressed thickness of the TIM disposed on top of the IHS 500. The compressed thickness of the TIM is the final thickness of the TIM after an assembled integrated circuit package is loaded into a socket and a heat sink is installed on top of the IHS 500. Depending on the height of the compressed TIM after assembly, in one embodiment, the perimeter of the IHS 500 may be elevated to form a ridge 552 having a maximum height of less than 10 mils above the interior portion 550 of the top side 510 of the IHS 500. In other embodiments, the perimeter of the IHS 500 may be elevated to form a ridge 552 having a maximum height of less than 2 mils above the interior portion 550 of the top side 510 of the IHS 500. In further embodiments, the maximum height of the ridge 552 extending above the interior portion 550 of the top side 510 of the IHS 500 is within a range of 50% to 75% of the thickness of the compressed TIM. While it is preferable for the ridge 552 to have the same height along the perimeter of the IHS 500 to compensate for an evenly warped top side 510, in alternative embodiments, the height of the ridge 552 may vary along the perimeter of the IHS 500, for example, to compensate for a warpage that is more severe along one edge.

According to embodiments of the present invention, the ridge 552 retains the TIM that is disposed on top of the IHS 500 and provides a bather to prevent the TIM from migrating over an edge of the IHS 500 when the IHS 500 is under warpage. In an embodiment, the ridge 552 is continuous along the perimeter of the top side 510 with no openings or grooves along the ridge 552. Although ideally, the ridge 552 is continuous along the perimeter of the top side 510, in an alternative embodiment, the ridge 552 may have breaks, notches, or grooves and still be able to retain or slow the migration of TIM. For example, the ridge 552 may be formed on a substantial portion of the perimeter such as 50%, 60%, 70%, 80%, or 90% of the perimeter. Depending on how the IHS 500 is warped, the breaks, notches, or grooves can be used to compensate for the different patterns of warpage. Furthermore, the breaks, notches, or grooves can also be used for alignment purposes during assembly of the integrated circuit package.

In one embodiment, the ridge 552 and the IHS 500 is a one-piece construction. That is, the ridge 552 is integrated into the IHS 500 and is formed as part of the IHS 500. For example, the ridge 552 can be formed by elevating the perimeter of the IHS 500 by stamping, machining, or die casting the IHS material. In another embodiment, the ridge 552 can be formed by bonding or welding one or more separate pieces of IHS material on top of the perimeter of a flat piece of IHS material. While it is preferable for better heat transfer to use the same type of material for the ridge 552 and the rest of the IHS 500, in a further embodiment where the ridge 552 is bonded to the IHS 500, the ridge 552 can be made of a different type of heat conductive material than the rest of the IHS 500, for example, to save material costs.

In an embodiment, the interior portion 550 of the top side 510 can be a square cavity to compensate for a convex warpage on the top side 510 of the IHS 500. Alternatively, the interior portion 550 can be a rectangular cavity or other geometric shapes to match the shape of the integrated circuit die. In one embodiment, the interior portion 550 is larger than the footprint of the integrated circuit die such that the ridge 552 does not sit above the integrated circuit die when the IHS 500 is thermally coupled to the integrated circuit die. In another embodiment, the interior portion 550 can be smaller than the footprint of the integrated circuit die such that a portion of the ridge 552 sits above a portion of the integrated circuit die.

The dimension of each side of the interior portion 550 may have the same proportion relative to the respective dimension of the integrated circuit die. For example, if the interior portion 550 is larger than the footprint of the integrated circuit die, the length of each side of the interior portion 550 can be 1.1, 1.25, or 1.5 times the length of the respective side of the integrated circuit die. If the interior portion 550 is smaller than the footprint of the integrated circuit die, the length of each side of the interior portion 550 can be 0.9, 0.8, or 0.75 times the length of the respective side of the integrated circuit die. Alternatively, only the dimensions along one axis (e.g., along two parallel sides) of the interior portion 550 may have the same proportion relative to the respective dimensions of the integrated circuit die. For example, in an embodiment, the length of the two sides of the interior portion 550 along an x-axis can be 1.1 times the respective dimensions of the integrated circuit die, whereas the length of the two sides of the interior portion 550 along an x-axis can be 0.9 times the respective dimensions of the integrated circuit die.

The corners along the plane of the interior portion 550 may have substantially straight edges or have curved or rounded edges. In one embodiment, the sidewall on the interior side of the ridge 552 is substantially vertical and forms an approximate right angle with the interior portion 550. In other embodiments, the sidewall on the interior side of the ridge 552 can have a slopped, curved, or curvilinear profile, and can form an obtuse angle with the interior portion 550. Similarly, the sidewall on the exterior side of the ridge 552 can also be substantially vertical or can have a slopped, curved, or curvilinear profile.

Figure 3:
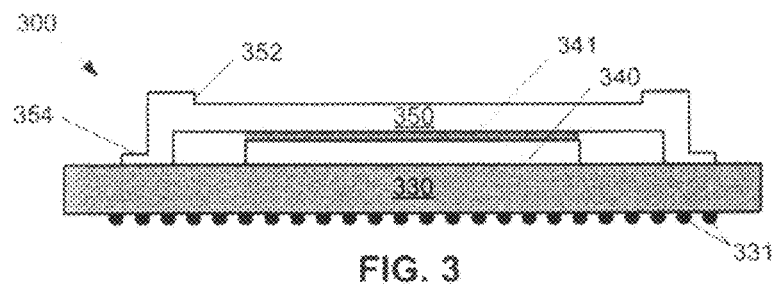
FIG. 3 illustrates a cross section view of an integrated circuit package according to an embodiment of the present invention.

FIG. 3 illustrates a cross section view of an exemplary integrated circuit package 300 with an improved IHS 350 with a top side ridged perimeter to retain TIM on the top side of the IHS 350 when the IHS 350 is under warpage. In one embodiment, the integrated circuit package 300 includes a package substrate 330, an integrated circuit die 340 electrically coupled to the package substrate 330, and a IHS 350 disposed above the integrated circuit die 340. In some embodiments, the integrated circuit die 340 is electrically coupled to the package substrate 330 through solder bumps such as C4 solder bumps.

The top side of the package level heat dissipation device 350 has a ridge 352 that is formed on the perimeter of the top side as described above. In an embodiment, the ridge 352 is integrated into the IHS 350 and is formed as part of the IHS 350, and is composed of the same material as the rest of the IHS 350. The purpose of the ridge 352 is to form a shallow cavity to retain a layer of TIM on the top side of the IHS 350. In an exemplary embodiment, the IHS 350 can be the IHS 500 of FIG. 5 described above.

The bottom side of the IHS 350 is thermally coupled to the integrated circuit die 340. In one embodiment, the IHS 350 is disposed above and thermally coupled to the integrated circuit die 340 through a layer of TIM 341 on the bottom side of the IHS 350. In some embodiments, the IHS 350 is attached, for example, with an epoxy, to the package substrate 330 to form a cavity with the package substrate 330 to encapsulate the integrated circuit die 340.

Figure 4:
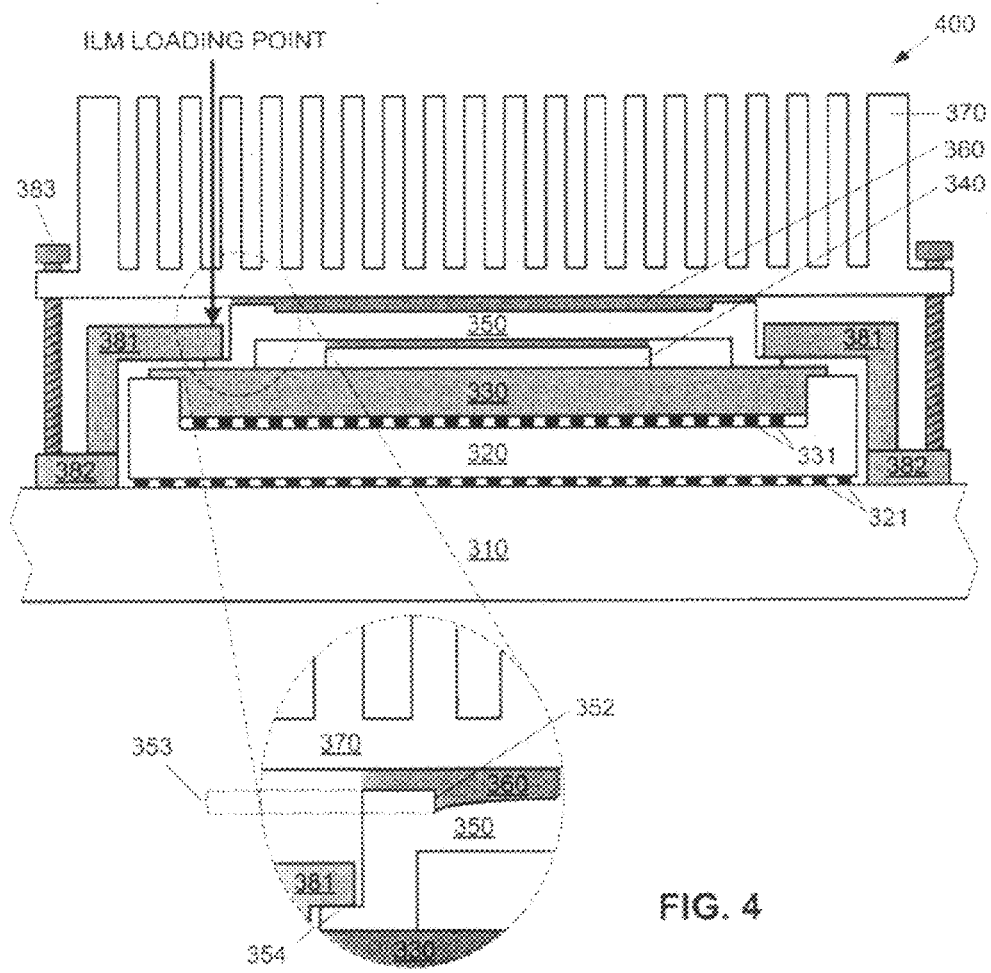
FIG. 4 illustrates a cross section view of an integrated circuit package assembly with a socket and a heat sink according to an embodiment of the present invention.

FIG. 4 illustrates a cross section view of the integrated circuit package assembly 400 after the integrated circuit package 300 has been inserted and secured into a socket 320 and after a component level heat dissipation device has been attached to the integrated circuit package 300 according to one embodiment of the present invention. In an exemplary embodiment, the component level heat dissipation device is a heat sink 370 as shown in FIG. 4. In alternative embodiments, the component level heat dissipation device can be a heat pipe or other heat dissipation devices.

The integrated circuit package 300 is placed into the socket 320 before the heat sink 370 is attached to the top of the IHS 350. In an embodiment, the socket 320 is mounted onto the printed circuit board (PCB) 310 through solder balls 321. In the integrated circuit package assembly 400, the integrated circuit package 300 is secured into the socket 320 with an ILM. The ILM has a retention frame 382 that is mounted onto the printed circuit board (PCB) 310 and surrounds the socket 320. The ILM has a load plate 381 that is hinged to the retention frame 382. The load plate 381 is a bracket that, when in a closed position, covers a portion of the step 354 along the edges of the IHS 350 while exposing the top surface of the IHS 350. After the integrated circuit package 300 has been placed into the socket 320, the load plate 381 is rotated into the closed position. A load lever pivoted to the retention frame 382 is engaged to forcibly press the load plate 381 down against the integrated circuit package 300, applying a downward force at the step 354 along the edges of the IHS 350 to secure the integrated circuit package 300 into the socket 320. The force of the ILM pushing down on the step 354 of the IHS 350 can exceed 100 pounds (lbs.) of force. The load lever is then locked into place to retain the load plate 381 in the closed position and to ensure proper electrical contact between contact points in the socket 320 and the solder balls 331 of the package substrate 330.

Before the heat sink 370 is installed, a thermal interface material (TIM) 360 is dispensed from a storage tube into the cavity formed by the ridge 352 on the top surface of the IHS 350. The TIM 360 is a paste-like substance such as a thixotropic paste, a carbon black paste, or a fluidic paste, and can be a phase change material or a thermal grease material that has a tendency to flow. The heat sink 370 is then placed over the TIM 360 and on top of the IHS 350. The heat sink 370 is then pressed down against the IHS 350. As the heat sink 370 pushes down on the TIM 360 on top of the IHS 350, the TIM 360 is compressed and distributed across the top surface of the IHS 350 and across the bottom surface of the heat sink 370, filling the cavity formed by the ridge 352 and up over the top of the ridge 352. In an embodiment, the initial thickness of the TIM 360 may be around 10 mils, and the final compressed thickness of the TIM 360 may be around 2 mils. Connectors 383 positioned at heat sink attachment points over the edges of the integrated circuit package 300 are used to secure the heat sink 370 to the retention frame 382 of the ILM and/or to the PCB 310. When the connectors 383 are tightened to secure the heat sink 370, an additional 50 lbs. of force can be asserted along the edges of the IHS 350.

Figure 1:
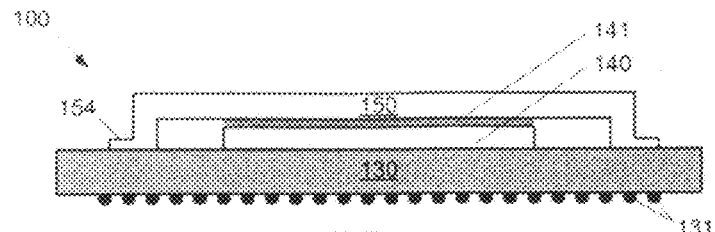
FIG. 1 illustrates a cross section view of a prior art integrated circuit package.
Figure 2:
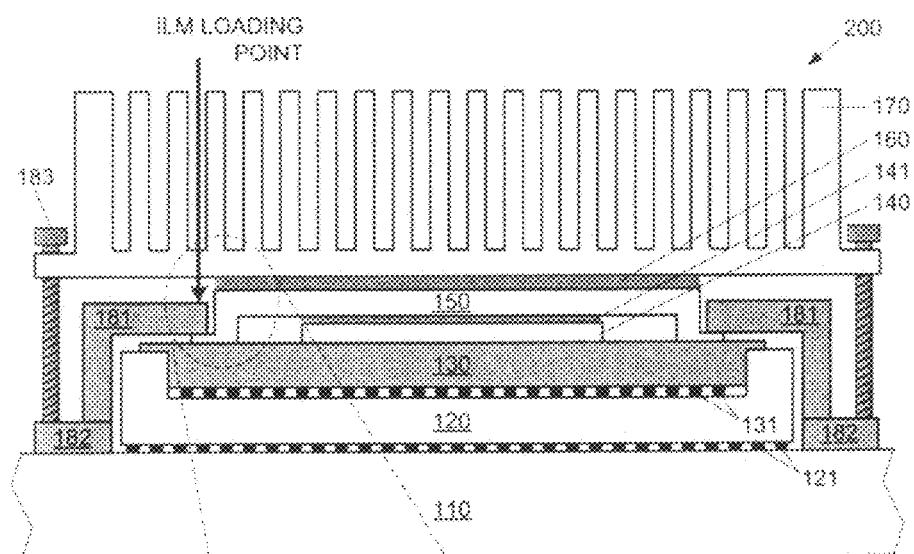
FIG. 2 illustrates a cross section view of a prior art integrated circuit package assembly with a socket and a heat sink.
Figure 2:
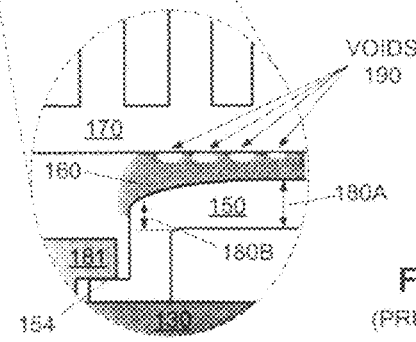

As a result of the downward forces from the ILM and the heat sink 370 that can total over 150 lbs. of force being applied to the edges of the IHS 350, the top side of the IHS 350 is warped with a convex curvature. In an embodiment, the warpage can be 100 um, 130 um, 150 um, or even 180 um or above. Despite this warpage, as illustrated in FIG. 4, the ridge 352 of the IHS 350 is sized to provide a barrier to retain the TIM 360 and to prevent the TIM 360 from migrating over an edge of the IHS 350. Because the TIM 360 must be in contact with both the IHS 350 and the heat sink 370 to promote heat transfer, the height of the ridge 353 is sized less than the compressed thickness of the TIM 360 such that when the TIM 360 is compressed during package assembly, the TIM 360 flows up and over the ridge 352 as shown. Otherwise, if the ridge 352 is too high, a large amount of the TIM 360 would sit in the cavity formed by the ridge 352 and the top surface of the IHS 350 without making contact with the heat sink 370. By forming the ridge 352 at a height 353 that is less than the thickness of the compressed TIM 360, the ridge 352 serves as a dam to prevent the TIM 360 material from flowing out from between the IHS 350 and the heat sink 370, while keeping the TIM 360 in contact with both the top side of the IHS 350 and in contact with the bottom side of the heat sink 370. As a result, TIM voids 190 such as those shown in FIG. 2 can be reduced or prevented all together to ensure proper thermal dissipation of the integrated circuit device during operation even when there is warpage on the top side of the IHS 350.

While the warpage of the IHS 350 as shown in FIG. 4 is convex, the geometry and the amount of warpage depends on factors such as the size and thickness of the IHS 350, the size of the integrated circuit die 340, the size of the package substrate 330, the number of layers in the package substrate 330, the amount of load applied to secure the integrated circuit package 300 into the socket 320, the amount of load applied to secure the heat sink 370 to the PCB 310, and the locations on the integrated circuit package 300 that these loads are applied to. Because of the numerous factors that can affect the warpage of the IHS 350, the warpage can take on any number of different geometries. To compensate for these different geometries, embodiments of the present invention can have the ridges or elevated portions on the top side of the IHS patterned accordingly to safeguard against TIM migration resulting from the different types and patterns of warpage.

Figure 6:
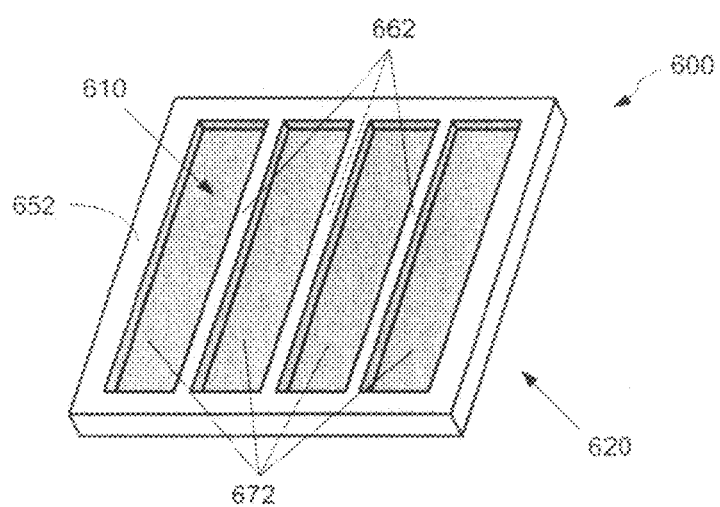
FIG. 6 illustrates an integrated heat spreader according to another embodiment of the present invention.

For example, FIG. 6 illustrates another embodiment of an IHS 600 in accordance with the present invention. In this embodiment, in addition to an elevated perimeter ridge 652, the top side 610 of the IHS 600 has one or more elevated or raised sections in the interior portion of the top side 610 to form interior ridges 662 to create a plurality of rectangular cavities 672. This configuration minimizes TIM degradation when the top side IHS warpage is convex along an axis that is perpendicular to the elevated interior ridges 662 in the interior portion of the top side 610. As shown, the horizontal axis of the figure is perpendicular to the elevated interior ridges 662 in the interior portion of the IHS 600. Hence, as shown, this configuration is used to minimize TIM degradation for a top side IHS warpage that is convex along the horizontal axis of the figure. In one embodiment, the height of the interior ridges 662 may be the same as the height of the perimeter ridge 652. In other embodiments, the height of the interior ridges 662 may be lower than the height of the perimeter ridge 652 to compensate for more extreme convex warpage.

Figure 7:
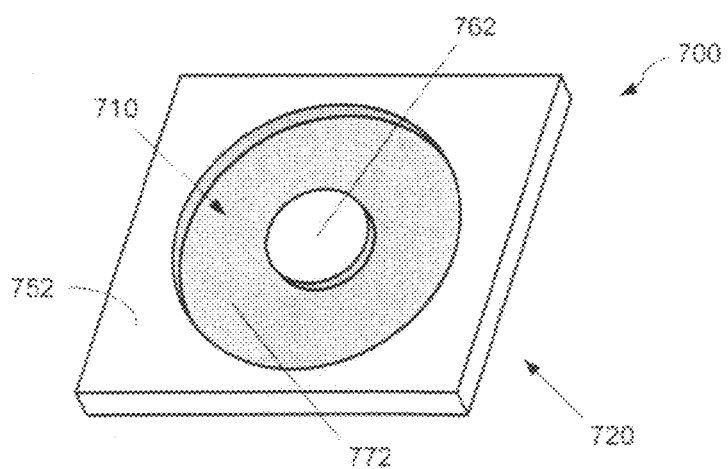
FIG. 7 illustrates an integrated heat spreader according to a further embodiment of the present invention.

FIG. 7 illustrates a further embodiment of an IHS 700 in accordance with the present invention. In addition to an elevated perimeter ridge 752, the top side 710 of the IHS 700 has an elevated or raised circular section at the center of the top side 710 to create an island ridge 762. Instead of having a square or rectangular shape, the interior sidewall of the elevated perimeter ridge 752 is circular. Hence, the interior island ridge 762 together with the elevated perimeter ridge 752 forms a torrid or ring shape cavity 772. This exemplary configuration minimizes TIM degradation when the top side IHS warpage is concave. In one embodiment, the height of the interior island ridge 762 may be the same as the height of the perimeter ridge 752. In other embodiments, the height of interior island ridge 762 may be higher than the height of the perimeter ridge 752 to compensate for more extreme concave warpage.

Similar to the perimeter ridge, the interior ridges according to embodiments of the present invention may have a consistent height or may have a height that varies such that a maximum height of the interior ridges is less than the compressed thickness of the TIM disposed on top of the IHS to allow the TIM to flow up and over the top of the interior ridges. Furthermore, the interior ridges may also have addition breaks, notches, or grooves or form different patterns depending on the geometry of the warpage of the IHS. The interior ridges can be formed in the same way as the perimeter ridge, and can be integrated as part of the IHS or be bonded to a flat piece of IHS material as described with reference to the IHS 500 of FIG. 5.

Figure 8:
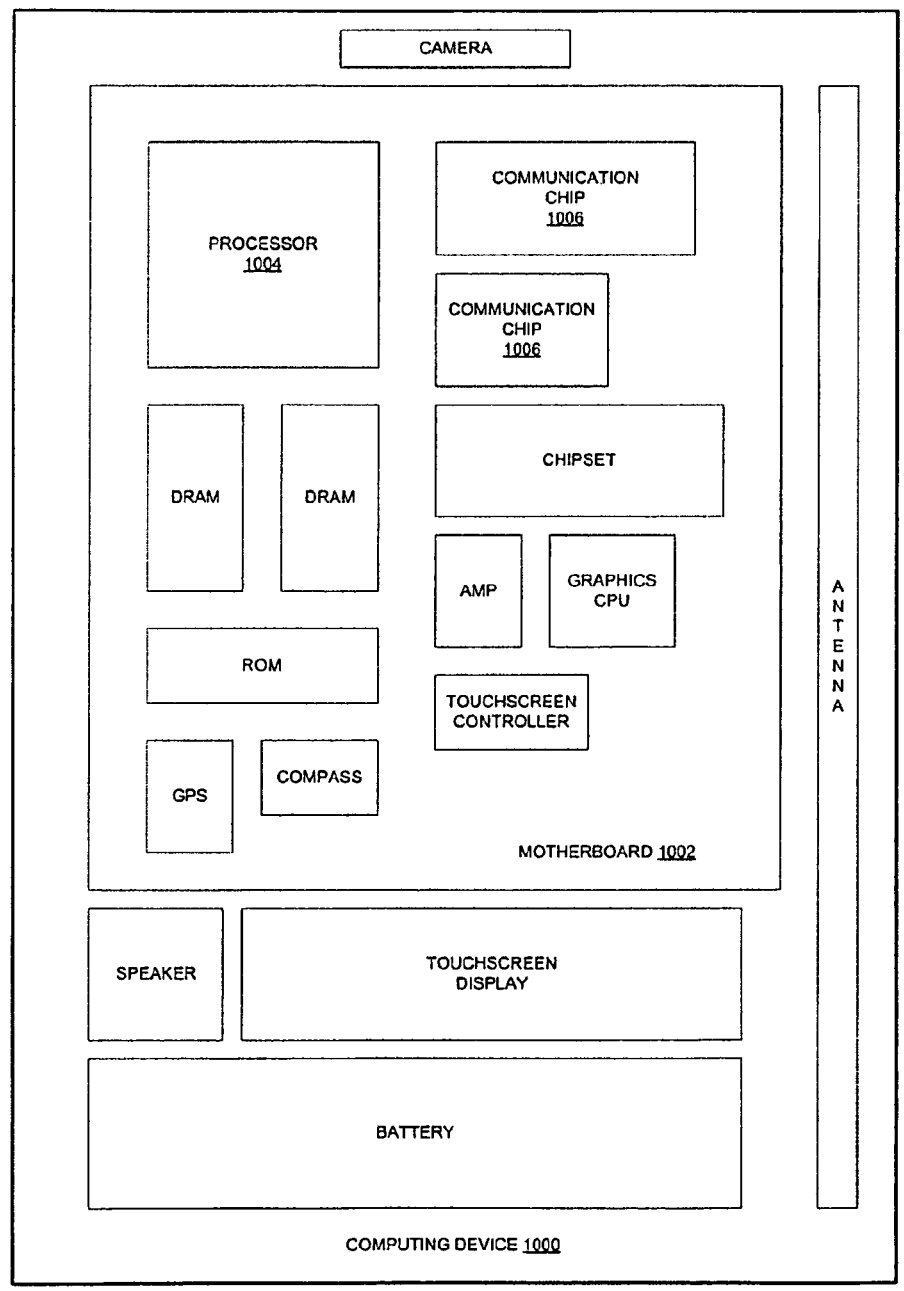
FIG. 8 illustrates a computing device according to an embodiment of the present invention.

FIG. 8 illustrates a computing device 1000 in accordance with one implementation of the invention. The computing device 1000 houses a board 1002. The board 1002 may include a number of components, including but not limited to a processor 1004 and at least one communication chip 1006. The processor 1004 is physically and electrically coupled to the board 1002. In some implementations the at least one communication chip 1006 is also physically and electrically coupled to the board 1002. In further implementations, the communication chip 1006 is part of the processor 1004.

Depending on its applications, computing device 1000 may include other components that may or may not be physically and electrically coupled to the board 1002. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing device 1000 includes an integrated circuit die packaged within the processor 1004. In some implementations of the invention, the integrated circuit die of the processor 1004 is packaged in an integrated circuit package that includes a ridged integrated heat spreader in accordance with implementations of the invention. The term "processor" may refer to any device or portion of a device that processes electronic data from registers and/or memory to transform that electronic data into other electronic data that may be stored in registers and/or memory.

The communication chip 1006 also includes an integrated circuit die packaged within the communication chip 1006. In accordance with another implementation of the invention, the integrated circuit die of the communication chip 1006 is packaged in an integrated circuit package that includes a ridged integrated heat spreader in accordance with implementations of the invention In further implementations, another component housed within the computing device 1000 may contain an integrated circuit die that is packaged in an integrated circuit package that includes a ridged integrated heat spreader in accordance with implementations of the invention In various implementations, the computing device 1000 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data.

The foregoing description of the preferred embodiments is provided to enable any person skilled in the art to make or use the present invention. Various modifications to these embodiments are possible, and the generic principles presented herein may be applied to other embodiments as well. As such, the present invention is not intended to be limited to the embodiments shown above but rather is to be accorded the widest scope consistent with the principles and novel features disclosed in any fashion herein.

What is claimed is:

1. An integrated heat spreader (IHS), comprising:
   a bottom side configured to be thermally coupled to an integrated circuit die; and
   a top side configured to be coupled to a component level heat dissipation device, wherein at least a portion of a perimeter of the top side is elevated relative to an interior portion of the top side and wherein the top side of the IHS further comprises one or more elevated sections in an interior portion of the top side to form a plurality of cavities on the top side of the IHS.

2. The IHS of claim 1, wherein the top side of the IHS further comprises an elevated circular section at a center of the top side to form a ring shape cavity.

3. The IHS of claim 1, wherein the perimeter is elevated to a height of less than 2 mils above an interior portion of the top side of the IHS.

4. The IHS of claim 1, wherein the perimeter is elevated by one of stamping, machining, or die casting.

5. The IHS of claim 1, wherein the IHS is made of a material selected from the group consisting of copper and diamond.

6. An integrated heat spreader (IHS), comprising:
   a bottom side configured to be thermally coupled to an integrated circuit die; and
   a top side configured to be coupled to a component level heat dissipation device, wherein at least a portion of a perimeter of the top side is elevated relative to an interior portion of the top side and wherein the top side of the IHS further comprises an elevated circular section at a center of the top side to form a ring shape cavity.

7. The IHS of claim 6, wherein the perimeter is elevated to a height of less than 2 mils above an interior portion of the top side of the IHS.

8. The IHS of claim 6, wherein the perimeter is elevated by one of stamping, machining, or die casting.

9. The IHS of claim 6, wherein the IHS is made of a material selected from the group consisting of copper and diamond.

10. An integrated heat spreader (IHS), comprising:
    a bottom side configured to be thermally coupled to an integrated circuit die; and
    a top side configured to be coupled to a component level heat dissipation device, wherein at least a portion of a perimeter of the top side is elevated relative to an interior portion of the top side and wherein the top side further comprises an interior island ridge.

11. The IHS of claim 10, wherein the top side of the IHS further comprises one or more elevated sections in an interior portion of the top side to form a plurality of cavities on the top side of the IHS.

12. The IHS of claim 10, wherein the perimeter is elevated to a height of less than 2 mils above an interior portion of the top side of the IHS.

13. The IHS of claim 10, wherein the perimeter is elevated by one of stamping, machining, or die casting.

14. The IHS of claim 10, wherein the IHS is made of a material selected from the group consisting of copper and diamond.

* * * * *